United States Patent
Syzdek et al.

(10) Patent No.: US 7,668,018 B2
(45) Date of Patent: Feb. 23, 2010

(54) ELECTRONIC DEVICE INCLUDING A NONVOLATILE MEMORY ARRAY AND METHODS OF USING THE SAME

(75) Inventors: Ronald J. Syzdek, Austin, TX (US); Gowrishankar L. Chindalore, Austin, TX (US); Thomas Jew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 400 days.

(21) Appl. No.: 11/695,722

(22) Filed: Apr. 3, 2007

(65) Prior Publication Data

US 2008/0247255 A1 Oct. 9, 2008

(51) Int. Cl.
G11C 16/04 (2006.01)

(52) U.S. Cl. .............. 365/185.29; 365/185.18; 365/195

(58) Field of Classification Search ............ 365/185.02, 365/185.05, 185.14, 185.26, 185.29, 195, 365/185.18, 218
See application file for complete search history.

(56) References Cited

U.S. PATENT DOCUMENTS

| | | | |
|---|---|---|---|
| 5,748,538 A | 5/1998 | Lee et al. | |
| 6,091,104 A * | 7/2000 | Chen | 257/326 |
| 6,331,724 B1 | 12/2001 | Chen et al. | |
| 6,377,489 B1 * | 4/2002 | Kim et al. | 365/185.26 |
| 6,584,034 B1 * | 6/2003 | Hsu et al. | 365/230.05 |
| 6,777,292 B2 | 8/2004 | Lee et al. | |
| 6,862,223 B1 * | 3/2005 | Lee et al. | 365/185.33 |
| 7,145,802 B2 | 12/2006 | Shone et al. | |
| 2002/0176280 A1 * | 11/2002 | Pasternak | 365/185.21 |
| 2005/0179079 A1 * | 8/2005 | Wu | 257/316 |
| 2007/0170958 A1 * | 7/2007 | Storms et al. | 327/112 |

OTHER PUBLICATIONS

PCT Search Report and Written Opinion from coordinating PCT Application No. PCT/US2008/057637 mailed Jul. 23, 2008.

* cited by examiner

*Primary Examiner*—Gene N. Auduong

(57) ABSTRACT

An electronic device can include a first memory cell and a second memory cell. The first memory cell can include a first source, and a second memory cell can include a second source. The first memory cell and the second memory cell can lie within a same sector of a memory array. In one embodiment, erasing the electronic device can include erasing the first memory cell while inhibiting the erase of the second memory cell. A third memory cell can have a third source and lie within another sector. In another embodiment, inhibiting the erase of the first memory cell can include placing the first source and the third source at a same potential. In a particular embodiment, the first source can be electrically insulated from the second source.

20 Claims, 5 Drawing Sheets

ELECTRONIC DEVICE INCLUDING A NONVOLATILE MEMORY ARRAY AND METHODS OF USING THE SAME

BACKGROUND

1. Field of the Disclosure

The present disclosure relates to electronic devices and methods and, more particularly, to electronic devices including nonvolatile memory arrays and methods of using the same.

2. Description of the Related Art

Nonvolatile memory ("NVM") arrays are used in electronic devices. Erasing of NVM arrays is performed by causing charges to tunnel through a dielectric layer ("tunnel oxide") of a charge-storage region (e.g. a floating gate, discontinuous storage elements, etc.). Tunneling charges can cause charge-trapping sites to form within the tunnel oxide. Charge-trapping sites build up and can eventually degrade the insulating properties of the tunnel oxide to the point that the charge-storage region can no longer store charge. Thus, by reducing the cumulative number of erase pulses performed on an NVM array, the life of the NVM array can be extend.

An NVM array can be designed so that erasing can be done on a memory cell by memory cell basis. However, erasing is a much slower process than programming or reading the NVM array. Thus, for most applications, overall performance and area can be improved by erasing the NVM array in blocks ("sectors") rather than one memory cell at a time. In one example, performing the erasing sequence on a sector of the NVM array includes applying a voltage of greater than 12 V to the control gate line of the individual memory cells of a sector relative to a bulk voltage of 0 V. During an erasing sequence, all memory cells of a sector of the NVM array are erased simultaneously. Memory cells of the sector are then checked individually to verify the erase of each memory cell was completed. If any memory cell of the sector is not completely erased, all the memory cells of the sector are further erased, including any memory cell previously verified as erased. The erasing sequence ends when all memory cells are verified as having completed erasing. In such a case, all memory cells in the sector receive an equal number of erase pulses.

However, the number of erasing pulses to completely erase a memory cell can vary within the sector. Thus, within a sector there can be a first-to-erase memory cell, which is the memory cell that is actually the first to become erased, and a last-to-erase memory cell, which is the memory cell that is actually the last to become erased. In the example, a last-to-erase memory cell may require more pulses to erase than a first-to-erase memory cell. Thus, the first-to-erase memory cell can be subjected to additional erasing pulses after verifying as having completed erasing. The additional erasing pulses shorten the potential life of the first-to-erase memory cell.

After the erasing the sector, the memory cells of the sector have a statistical distribution of threshold voltage ("$V_{th}$") values. As the number of cells in the sector increases, the delta $V_{th}$ between the first-to-erase and last-to-erase memory cells can increase reducing the write/erase endurance capability of the device. The size of the delta $V_{th}$ is in large part controlled by the number of memory cells erased at one time. Therefore, control of the delta Vth can limit the size of a sector, and the erase performance of the NVM array.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
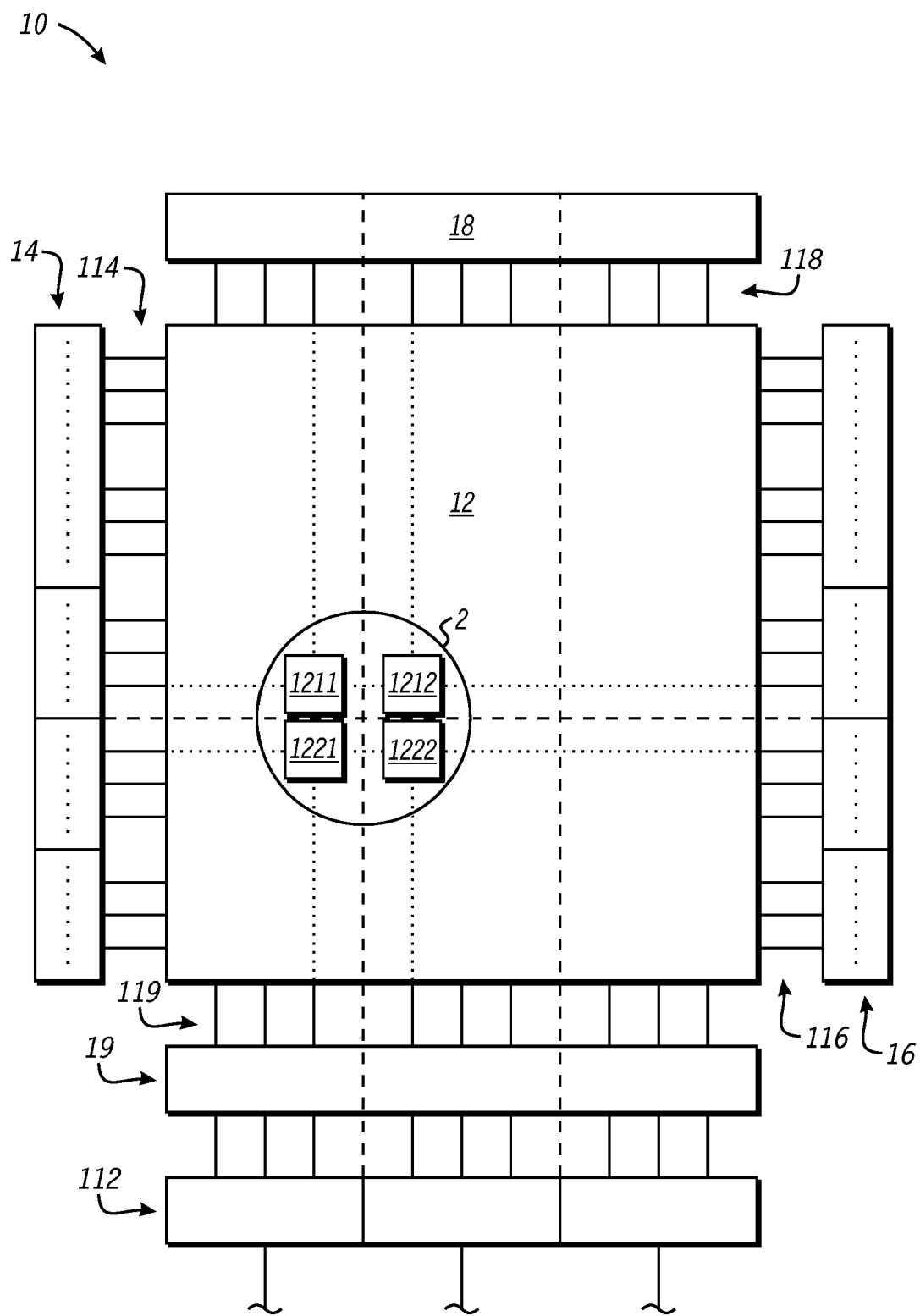
FIG. 1 includes an illustration of a block diagram of an NVM array of an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include an NVM array having a first memory cell and a second memory cell. The first memory cell can include a first source, and a second memory cell can include a second source. The first memory cell and the second memory cell can lie within a same sector of a memory array. In one embodiment, erasing the electronic device can include erasing the first memory cell while inhibiting the erase of the second memory cell. A third memory cell can have a third source and lie within another sector. In another embodiment, inhibiting the erase of the first memory cell can include placing the first source and the third source at a same potential. In a particular embodiment, the first source of the first memory cell can be electrically insulated from the second source of the first memory cell.

By inhibiting erasing of a set of memory cells including a particular memory cell of the first sector while erasing a set of memory cells including another memory cell of the first sector, fewer charges tunnel through the tunnel oxide of the particular memory cell where the erasing is inhibited during the erase of the first sector. Passing fewer charges through the tunnel oxide during a sector erase cycle can increase the life of the particular memory cell, and thus, the electronic device. Also, by inhibiting erasing of a set of memory cells after they have been verified as erased, a range of a final distribution of $V_{th}$ values for the first sector can be decreased. Specific embodiments of the present disclosure will be better understood with reference to FIGS. 1 through 5.

The term "group" with respect to memory cells is intended to mean a collection of memory cells within an array of memory cells that correspond to a data input/output ("data I/O") of the array. A group can include memory cells from different sectors of the array.

The term "sector" is intended to mean a collection of memory cells within an array of memory cells that is erased during an erasing sequence. A sector can include memory cells from different groups of the array.

The term "set" is intended to mean one or more memory cells within an array of memory cells common to a particular sector of memory cells and a particular group of memory cells. A group or a sector can include a plurality of sets of memory cells.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a block diagram of an NVM array 10. The NVM array 10 includes a memory matrix 12, a control gate controller module 14, a select gate controller module 16, a source bit line controller module 18, a drain bit line controller module 19, and a data I/O block 112. Portions of the NVM array 10 are electrically coupled to a processor (not illustrated) that may or may not be present on the same substrate as the NVM array 10. The processor sends data to and receives data from the NVM array 10 in order that some or all of the memory matrix 12 be read, written, erased, or any combination thereof.

The memory matrix 12 is a portion of the NVM array 10 where information can be stored and subsequently read back. The memory matrix 12 is electrically coupled to the control gate controller module 14 by a plurality of control gate lines 114 and is electrically coupled to the select gate controller module 16 by a plurality of select gate lines 116. The memory matrix 12 is electrically coupled to the source bit line module 18 by a plurality of source bit lines 118 and is electrically coupled to the drain bit line controller module 19 by a plurality of select gate lines 119. As illustrated, the source bit lines 118 and the drain bit lines 119 are orthogonal to the control gate lines 114 and the select gate lines 116. In another embodiment (not illustrated), the control gate lines 114 and the select gate lines 116 are orthogonal to each other.

In the illustrated embodiment, the memory matrix 12 includes memory cells arranged in sets. Each set includes memory cells associated with a particular sector and a particular group of memory cells. In the illustrated example, the memory matrix 12 includes a set 1211 of memory cells, a set 1212 of memory cells, a set 1221 of memory cells, and a set 1222 of memory cells. Each sector is electrically coupled to a corresponding control gate controller of the control gate controller module 14 by control gate lines 114, and a select gate controller of the select gate control module 16 by select gate lines 116. Each group is electrically coupled to a corresponding source bit line controller of the source bit line control module 18 by source bit lines 118, and a drain bit line controller of the drain bit line control module 19 by drain bit lines 119. As will be described later, a multiplexer (not illustrated) can be used such that a source bit line 118, a drain bit line 119, or any combination thereof is electrically coupled to a data I/O of the data I/O block 112. In one embodiment, the data I/O block 112 includes a plurality of data I/Os, and each memory cell of a group of memory cells is electrically coupled to a corresponding data I/O of the data I/O block 112.

Figure 2:
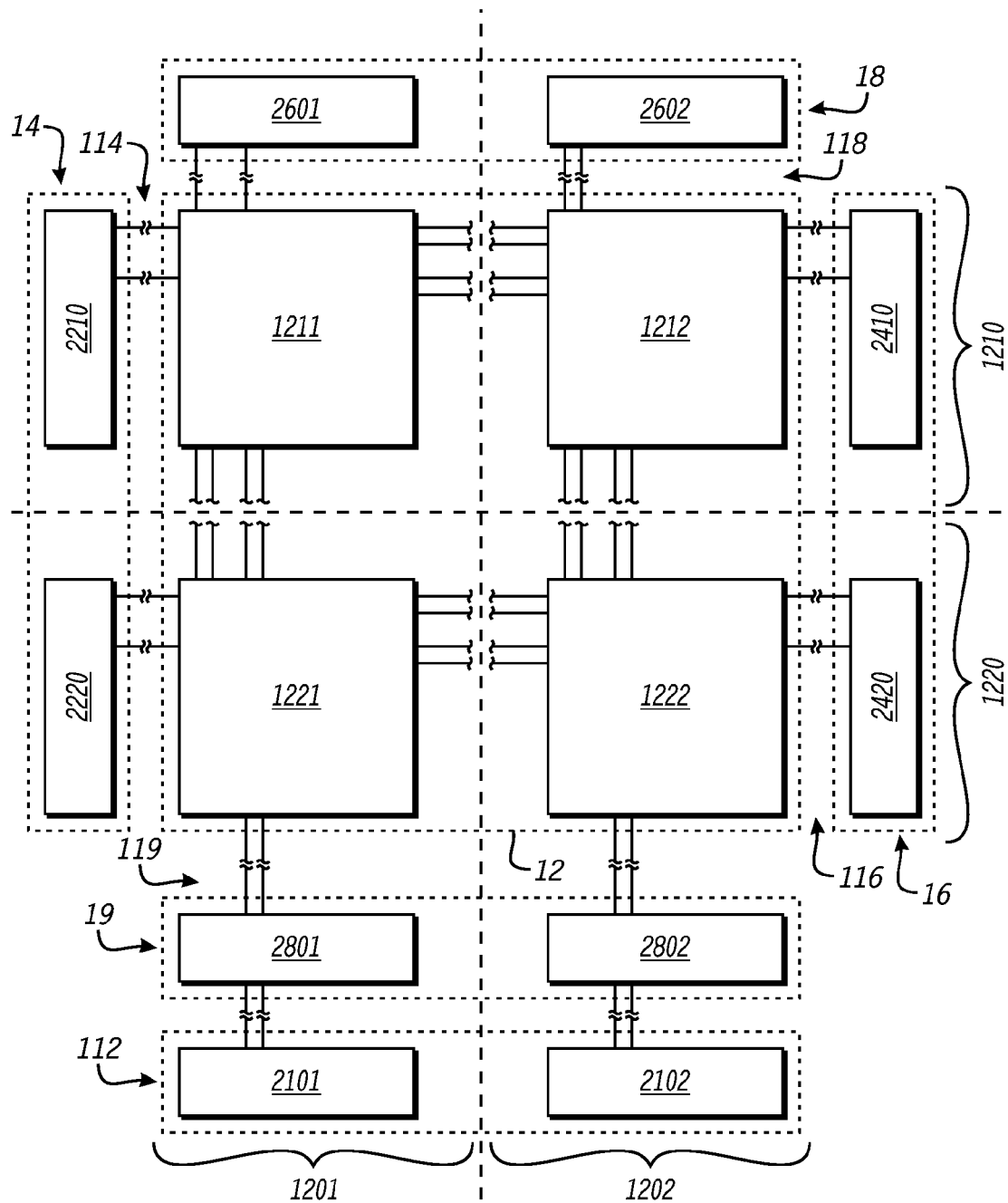
FIG. 2 includes an illustration of a block diagram of a portion of the block diagram of FIG. 1 including two sets of memory cells from a first sector of the NVM array and two sets of memory cells from a second sector of the NVM array.

FIG. 2 includes an illustration of block diagram of a portion of the NVM array 10 including the set 1211, the set 1212, the set 1221 and the set 1222, and corresponding portions of the control gate controller module 14, the select gate controller module 16, the source bit line controller module 18, the drain bit line controller module 19, and the data I/O block 112. In the illustrated embodiment, the set 1211 and the set 1212 lie within a sector 1210, and the set 1221 and the set 1222 lie within the sector 1220. Also, the set 1211 and the set 2121 lie within a group 1201, and the set 1212 and the set 1222 lie within the group 1202. Although illustrated with two sectors and two groups for clarity, many more groups and sectors may be present within the memory matrix 12.

Control gate controller module 14 includes a control gate controller 2210 and a control gate controller 2220. Control gate controller module 14 controls the electrical coupling of individual control gate lines 114 of the NVM array 10. As illustrated, the control gate controller 2210 controls the control gate lines of a sector 1210 of the NVM array 10, and the control gate controller 2220 controls the control gate lines of the sector a 1220 of the NVM array 10.

The select gate controller module 16 includes a select gate controller 2410 and a select gate controller 2420. The select gate controller module 16 controls the electrical coupling of individual select gate lines within the NVM array 10. As illustrated, the select gate controller 2410 controls the select gate lines of sector 1210, and the select gate controller 2420 controls the select gate lines of the sector 1220 of the NVM array 10.

The source bit line controller module 18 includes a source bit line controller 2601 and a source bit line controller 2602. The source bit line controller module 18 controls the individual source bit lines 118 of the NVM array 10. As illustrated, the source bit line controller 2601 controls the source bit lines 118 of a group 1201, and the source bit line controller 2602 controls the source bit lines 118 of a group 1202.

The drain bit line controller module 19 includes a drain bit line controller 2801 and a drain bit line controller 2802. The drain bit line controller module 19 controls the individual drain bit lines 119 within the NVM array 10. As illustrated, the drain bit line controller 2801 controls the drain bit lines 119 of group 1201, and the drain bit line controller 2802 controls the drain bit lines 119 of the group 1202.

The data I/O block 112 converts the input from the memory matrix 12 to an output string. Although not illustrated, a multiplexer may lie between the input of the data I/O block 112 and the output of the source bit line controller 14, output of the drain bit line controller 16, or any combination thereof. Thus, the source bit lines 118, the drain bit lines 119, or any combination thereof are electrically coupled to the data I/O block 112. The data I/O block 112 includes a data I/O for each group of the memory matrix 12. As illustrated, the data I/O block 112 includes a data I/O 2101 corresponding to the group 1201 and a data I/O 2102 corresponding to the group 1202. In one embodiment, the data I/O 2101, the data I/O 2102, or any combination thereof includes a sense amplifier (not illustrated). In a particular embodiment, the same sense amplifier can be used to read and verify erase for a group of memory cells of the memory matrix 12.

Figure 3:
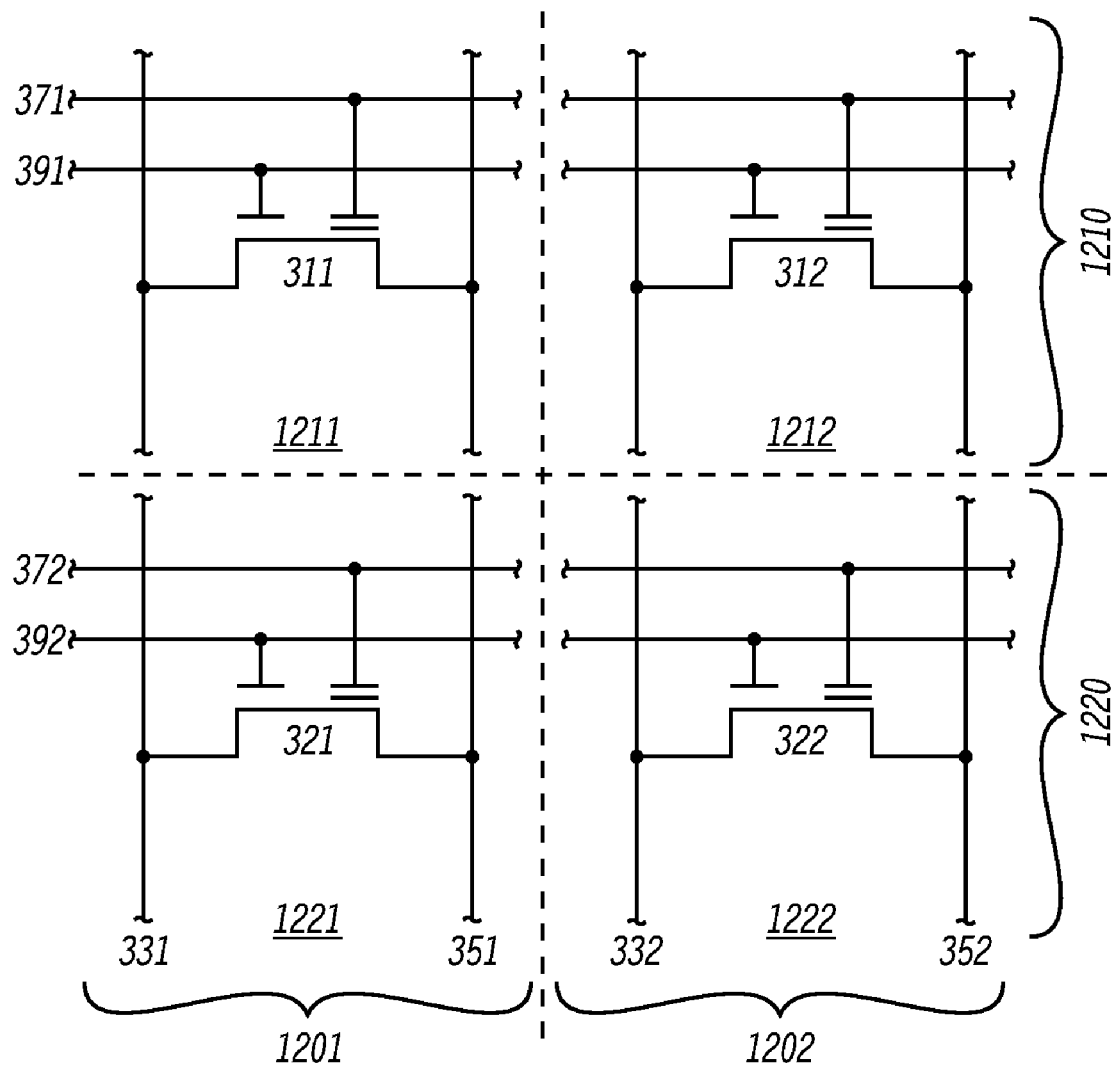
FIG. 3 includes an illustration of a circuit diagram of particular memory cells from each of the four sets of memory cells the block diagram of FIG. 2.

FIG. 3 includes an illustration of circuit diagram according to one embodiment. A memory cell 311, a memory cell 312, a memory cell 321, and a memory cell 322 are oriented with the memory matrix 12, as illustrated by the group 1201 and the group 1202 designators and the sector 1210 and the sector 1220 designators. Memory cell 311, memory cell 312, memory cell 321, and memory cell 322 lie within the within the set 1211, the set 1212, the set 1221, and the set 1222, respectively. As illustrated, memory cell 311, memory cell 312, memory cell 321, and memory cell 322 include a split-gate memory cells. In a particular embodiment, features described as being electrically coupled can be electrically connected.

Referring to FIG. 3, a particular drain bit line of the plurality of drain bit lines 119 includes drain bit line 331 that is electrically coupled to a drain of memory cell 311 and to a drain of memory cell 321. Another particular drain bit line of the plurality of drain bit lines 119 includes drain bit line 332 that is electrically coupled to a drain of memory cell 312 and to a drain of memory cell 322. A particular source bit line of the plurality of source bit lines 118 includes source bit line 351 and is electrically coupled to a source of memory cell 311 and to a source of memory cell 321. Another particular source bit line of the plurality of source bit lines 118 includes source bit line 352 and is electrically coupled to a source of memory cell 312 and to a source of memory cell 322.

A particular control gate line of the plurality of control gate lines 114 includes control gate line 371 that is electrically coupled to a control gate of memory cell 311 and to a control gate of memory cell 312. Another particular control gate line of the plurality of control gate lines 114 includes control gate line 372 that is electrically coupled to a control gate of memory cell 321 and to a control gate of memory cell 322. A particular select gate line of the plurality of select gate lines 116 includes select gate line 391 that is electrically coupled to a select gate of memory cell 311 and to a select gate of memory cell 312. Another particular select gate line of the plurality of select gate lines 116 includes select gate line 392 that is electrically coupled to a select gate of memory cell 321 and to a select gate of memory cell 322.

Figure 4:
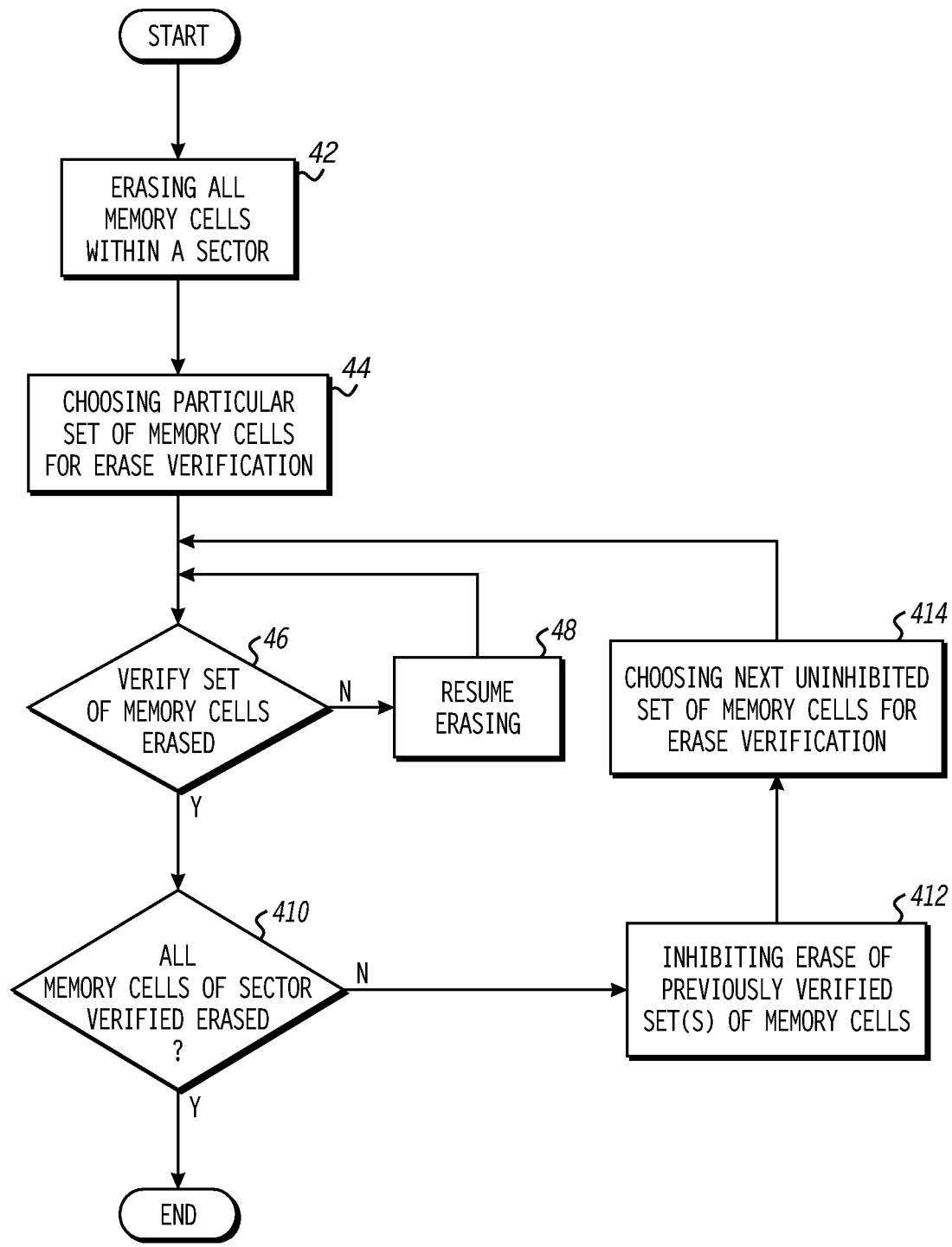
FIG. 4 includes an illustration of a flow chart of an erasing process of the NVM array.

FIG. 4 includes an illustration of a flow chart of a process of erasing a sector of the NVM array 10 according to one embodiment. As illustrated at block 42, the method includes erasing all the memory cells within the sector. As used herein, erasing refers to an operation that attempts to erase a memory cell. Such erasing can include a complete erasing or a partial erasing of the memory cell. In one embodiment erasing includes applying an erasing pulse to a set of memory cells wherein a particular memory cell of the set of memory cells is completely erased and another particular memory cell is partially erased. Erasing of a memory cell can occur by placing a potential difference of greater than approximately 12 V between a control gate and a source of the memory cell for a length of time, such as can be defined by a pulse. For simplicity, in a split-gate memory cell, the source refers to the terminal closer to the control gate, as compared to a drain of the same split-gate memory cell. The control gate is electrically coupled to a control gate line, and the source is electrically coupled to a source bit line. The control gate line and source bit line are placed at voltages to achieve a potential difference to allow charge carriers to tunnel through a tunnel dielectric of the memory cell.

Each memory cell includes a select gate that is electrically coupled to a select gate line. In one embodiment, substantially all of the select gate lines are placed at a voltage that substantially prevents any significant current flow between the sources and drains of the memory cells during the erasing. Each memory cell includes a drain that is electrically coupled to a drain bit line. In one particular embodiment, the drain bit line can be placed at a voltage, such that a potential difference between the control gate line and the drain bit line is less than the potential difference between the control gate line and the source bit line. In another particular embodiment, the drain bit line and the source bit line are at substantially the same voltage. In still another embodiment, the drain bit lines are at a voltage used for a source bit line of a memory cell where erase would be inhibited as described later in this specification. Although described as occurring at the potential difference of greater than approximately 12 V between the control gate and the source, the voltage at which erasing occurs can depend on the thickness and material composition of the tunnel dielectric. In another embodiment, the voltage at which erasing occurs can be different.

Referring to FIG. 3, in one embodiment, the sector 1210 is to be erased ("selected"), and the sector 1220 is not to be erased ("unselected"). In one embodiment, the source bit lines 351 and 352 and the select gate lines 391 and 392 can be placed at approximately 0 V. The control gate line 371 of the selected sector 1210 is placed at approximately 14 V, and the control gate line 372 of the unselected sector 1220 is placed at approximately 1.5V. In a particular embodiment, the drain bit lines 331 and 332 are placed at a voltage of approximately 1.2 V. In another particular embodiment, the drain bit lines 331 and 332 are placed at a voltage of approximately 0 V.

Referring to block 44 of FIG. 4, after erasing all the memory cells within the sector, as described with respect to block 42, a particular set of the plurality of sets of memory cells is chosen for erase verification. The chosen set of memory cells includes some, but not all, of the memory cells within the sector. In one embodiment, the particular set of memory cells includes the memory cells of the selected sector corresponding to a particular data I/O. In a particular embodiment as previously described with respect to FIGS. 2 and 3, the group 1201 includes the set 1211 and corresponds to the data I/O 2101, and the group 1202 includes set 1212 corresponds to the data I/O 2102. The particular set of memory cells can include the set 1212 and not include the set 1211.

The basis for choosing the particular set of memory cells for erase verification can be varied. The basis can include monitoring the currents flowing through the source bit lines of the particular set corresponding to the data I/O, choosing the particular set corresponding to the data I/O based on a predetermined basis (e.g., cycling through the data I/Os in numeric order or in a round robin fashion), randomly choosing the particular set corresponding to the data I/O, other suitable basis, or any combination thereof. For example, referring to FIG. 3, the particular set can include the set 1212 of the sector 1210. The set 1212 includes memory cell 312 and is chosen for erase verification. The set 1211 of the sector 1210 includes memory cell 311 and remains unchosen for the erase verification.

Referring to decision tree 46 of FIG. 4, after choosing the particular set of memory cells for erase verification, the method further includes verifying the set of memory cells is erased. Verification that a set of memory cells is erased can include reading each memory cell of the set of memory cells. In one embodiment, verification of erasing can include reading each memory cell of the particular sector. In a particular embodiment, the same sense amplifier (not illustrated) within the data I/O can be used for verification, as described, and during reading after some of memory cells within the sector have been reprogrammed (after all erasing and verification had been completed).

In one embodiment, if during erase verification erasing of all the memory cells of the set is found to be incomplete (the "NO" branch of decision tree 46). The method includes resuming erasing of the set of memory cells, as illustrated at block 48. In a particular embodiment, resuming erasing includes performing another erasing pulse for the chosen set of memory cells. As described later, with respect to block 412, in another particular embodiment, inhibiting erasing of another set of memory cells of the plurality of sets of memory cells may or may not be performed during performing another erasing pulse for the chosen set of memory cells. The effectiveness of resuming erasing on the chosen set of memory cells can be verified again as previously described at block 48.

Eventually, repeating the sequence of block 48 and decision tree 46 allows all of the memory cells within the set to be verified as being erased ("YES" branch from decision tree 46). For example, referring to FIG. 3, each memory cell of the set 1212 is read. If memory cell 312 fails to be verified as erased, another erasing pulse is performed on the set 1212, including memory cell 312, that failed verification. Verifying the erase of the set 1212 is then repeated. Erasing pulses and verifications can be further repeated as needed or desired until all memory cells 312 within the set 1212 are verified as being erased.

After the set of memory cells is verified as erased, the method includes determining whether all the memory cells of the sector have been verified as erased, as illustrated at decision tree 410. For example, referring to FIG. 3, if the set 1212 of the sector 1210 has just completed erase verification as described for decision tree 46 of the FIG. 4, a determination is made as to if the other sets of memory cells of the sector 1210, such as set 1211, have also complete verification, at decision tree 410 in FIG. 4.

If any memory cells of the sector have not yet been verified as having been erased (the "NO" branch of decision tree 410), the method also includes inhibiting erase of the previously verified set(s) of memory cells, at block 412. In one embodiment, inhibiting erasing occurs when a potential difference between the control gate and source of a memory cell is insufficient for programming to occur at one memory cell of the sector, when the potential difference is sufficient at another memory cell of the sector. For example, the potential difference is less than 12 V at one memory cell when the potential difference is greater than 12 V at another memory cell of the sector.

In the embodiment as illustrated in FIG. 2, the control gate lines 114, the select gate lines 116, and the drain bit lines 119 for the selected sector (e.g., the sector 1210) are substantially the same during erasing and inhibiting. However, the source bit lines 116 of the set 1212, which has been verified, are placed at a voltage closer to the voltage of the control gate lines 119 of the sector 1210. In a particular embodiment, erasing of the set 1211 is to continue while further erasing of the set 1212 is to be inhibited. Referring to FIG. 3, the voltages on the control gate lines 371 and 372, the select gate lines 391 and 392, and the drain bit lines 331 and 332 are substantially unchanged from when all memory cells within the sector 1210 were being erased. In one embodiment, memory cell 311 within the set 1211 is to be further erased, and the source bit line 351 is also substantially unchanged. The source bit line 352 is placed at a voltage closer to the voltage of the control gate line 371. For example, source bit line 352 is placed at a voltage of approximately 5 V when control gate line 371 is placed at a voltage of approximately 14 V.

Referring to the embodiment of FIG. 4, after inhibiting erase of the previously verified sets of memory cell(s), the method further includes choosing a next uninhibited set (i.e., not yet verified as erased) of memory cells, at block 414. The basis for choosing the uninhibited set of memory cells can be any of the embodiments as described with respect to block 44. The basis used at block 414 may be the same or different from the basis used at block 44. The method continues as previously described. Eventually, all memory cells within the sector will be verified as being erased ("YES" branch from decision tree 410). At this point, the erase sequence for the sector is completed. The recently erased sector (e.g. the sector 1210) can be programmed, another sector (e.g., the sector 1220) can now be selected for erase and the recently erased sector (e.g., the sector 1210) becomes unselected, or any combination thereof.

For example, an erasing pulse can be performed on all memory cells of a sector. Each memory cell of the sector can be read, and a determination made if the erase was complete. Erase is inhibited on sets of memory cells where all memory cells are verified as erased, and erasing is continued by performing another erase pulse on the sector. The process of verifying and continuing erasing continues until all memory cells of the sector have been verified as erased.

Figure 5:
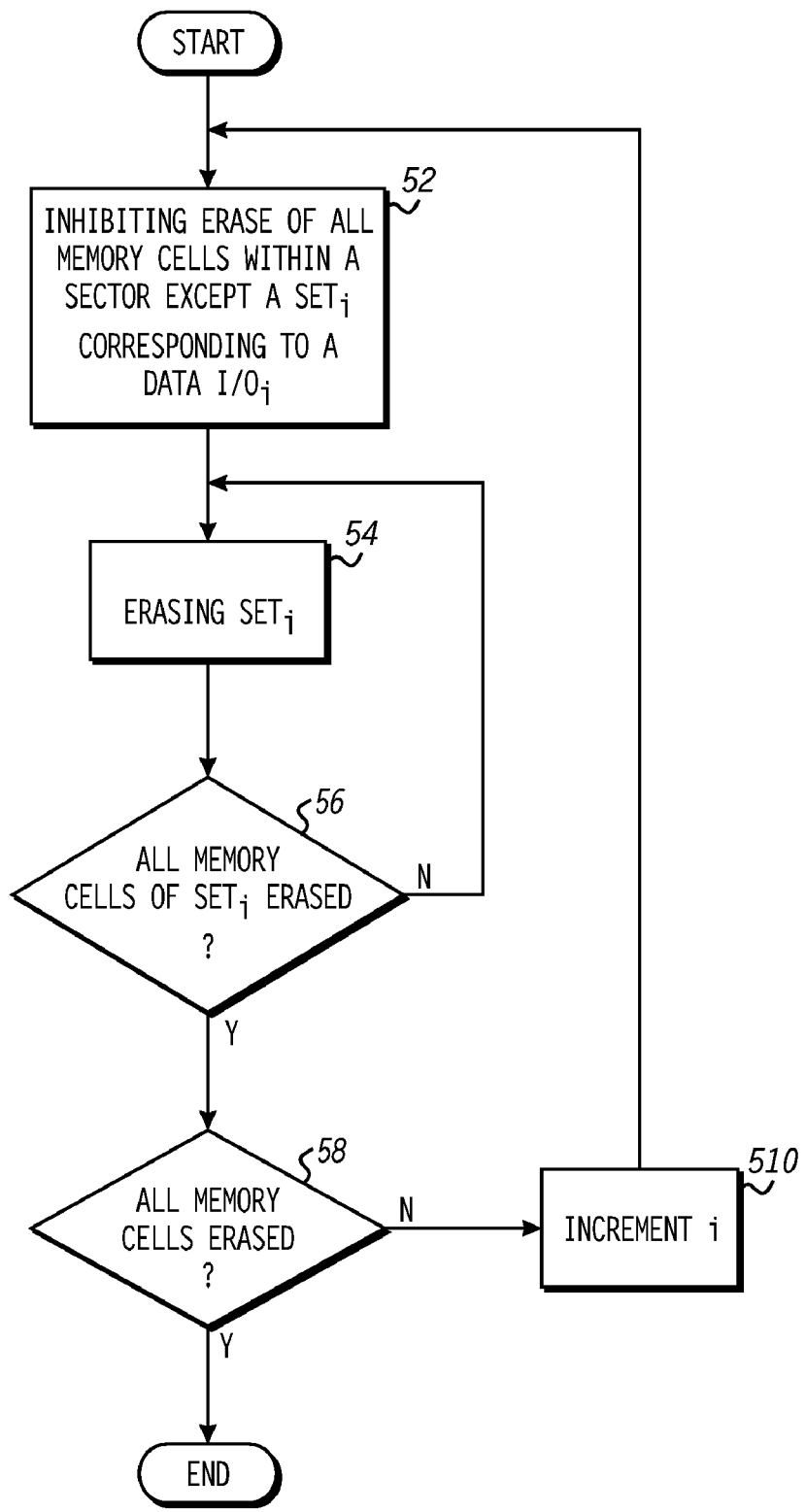
FIG. 5 includes an illustration of a flow chart of an erasing process of the NVM array according to an alternative embodiment.

Alternatively, a sector of memory cells can be erased and verified one set at a time. FIG. 5 includes an illustration of a flow chart of erasing a sector of the NVM array 10 according to another embodiment. The components of the NVM array 10 are arranged and electrically coupled to each other as previously described in an embodiment with respect to FIGS. 1 through 3. Some references to FIG. 3 are used to clarify how the flow chart of FIG. 5 and circuit diagram of FIG. 3 relate to one another. As with FIG. 4, FIG. 5 is illustrated using a split-gate device, and the convention of referring to the terminal closer to the control gate in a split gate device as the source is used. Although illustrated below with four sets of memory cells, each set from one of two sectors and one of two groups, in another embodiment, the memory matrix can include more sets, more sectors, more groups, or any combination thereof.

As illustrated at block 52 of FIG. 5, the method includes inhibiting erase of all memory cells within the sector except for a $set_i$ corresponding to a data $I/O_i$. In the illustrated embodiment, each source bit line is electrically coupled to a corresponding data I/O, such as data $I/O_i$. Thus, the potential of the source of each memory cell of a particular set of memory cells to be erased is controlled by the corresponding data I/O. In one embodiment, the source bit line coupled to the data $I/O_i$ is set to approximately 0 V, and the other source bit lines coupled to other data I/Os of the sector are set to a potential closer to a potential of the control gate line when the $set_i$ would be erasing. In another embodiment, the drain bit lines are placed at a potential in a range of approximately 0 V to approximately 5 V, and the select gate lines are placed at a potential of approximately 0 V or are electrically floating. In a particular embodiment, the drain bit lines are placed at a potential in a range of approximately 1 to approximately 2 V.

In another particular embodiment, inhibiting erase a set of memory cells includes placing a source bit line of an inhibited set at a potential approximately 5 V higher than a source bit line of an uninhibited set, such that a source of inhibited memory cells lies at a higher potential that a source of an uninhibited memory cell. For example, referring to FIG. 2, the sector 1210 is selected to be erased and the sector 1220 is unselected. The set 1211 is within the sector 1210 and within group 1201. The group 1201 corresponds to or is electrically coupled to a data I/O 2101. The set 1212 is within the sector 1210 and within the group 1202. The group 1202 corresponds to or is electrically coupled to the data I/O 2102. Referring to FIG. 3, the $set_i$ includes the set 1211, and all memory cells of the sector 1210 other than $set_i$ includes the set 1212. Although illustrated as including two sets, in another embodiment, a sector can include more sets of memory cells. In a particular embodiment, the source bit line 352 is placed at a potential such that, when the control gate line 371 would be set to erase memory cell 311, a voltage difference between the source bit line 352 and control gate line 371 would be insufficient for erasing to occur at memory cell 312. In a particular embodiment, the source bit line 351 is placed at a potential of approximately 0 V, and the source bit line 352 is placed at a potential of approximately 5 V.

Referring to FIG. 5, the method includes erasing the $set_i$, as illustrated in block 54. Erasing the $set_i$ can include placing the control gate line of the sector to be erased at a potential sufficient to cause erasing of the $set_i$ for a length of time, such as can be defined by a pulse, as previously described with respect to FIG. 4, block 42. In one embodiment, erasing substantially only occurs at the memory cells of $set_i$ and the potential difference between the control gates and sources of the other memory cells of the sector to be erased is insufficient for erasing to occur. For example, referring to FIG. 3, after placing the source bit line 351 at approximately 0 V and the source bit line 352 at approximately 5 V, the voltage of the control gate line 371 is placed at a potential sufficient to erase memory cell 311 of the set 1211. As illustrated, the control gate line 371 of the sector 1210 is electrically coupled to memory cell 311 of the set 1211 and memory cell 312 of the set 1212. In a particular embodiment, the voltage of the control gate line 371 is set to 14 V. With the potential of the source bit lines 351 and 352 set as previously described with respect to block 52, an erasing condition substantially occurs at the memory cell 311 of set 1211 and not at the memory cell 312 of the set 1212.

However, the source bit lines 351 and 352 are each electrically coupled to another set of memory cells within an unselected sector, such as the set 1221 and the set 1222 of the sector 1220, respectively. The source of memory cell 321 of the set 1221 can have a substantially same potential as the source of memory cell 311, and the source of memory cell 322 of the set 1222 can have a substantially same potential as the source of memory cell 312. In one embodiment, the control gate line 372 is placed at a potential in a range of approximately the potential of the source of memory cell 321 and approximately the potential of the source of memory cell 322. In a more particular embodiment, the control gate of an unselected sector is placed at a potential in a range of approximately 0 V to approximately 3 V.

Referring to FIG. 5, after erasing $set_i$, the method includes determining if all memory cells of the $set_i$ are erased, as illustrated at decision tree 56. In one embodiment, determining includes verification as described with respect to Block 46 of FIG. 4. In a particular embodiment, a memory cell of the $set_i$ is determined to be partially and not completely erased, (the "NO" branch of decision tree 56). The method includes erasing and verifying the $set_i$ again, as illustrated at block 54 and decision tree 56. Eventually, repeating the sequence allows all memory cells of $set_i$ to be verified as erased, (the "YES" branch of decision tree 56).

The process further includes determining if all memory cells of the sector have been verified as erased, as illustrated at decision tree 58. In one embodiment, the sector includes a known number of sets that are processed in a known pattern such that a particular set is a known last set of the sector. In another embodiment, the number of sets that have been verified is tracked and compared to the known number of sets. In a particular embodiment, at the decision tree 58, a determination is made if $set_i$ is the known last set of the sector. In another embodiment, another test may be performed to determine if all memory cells of the selected sector have been verified as having been completely erased.

If all the memory cells have not been verified as erased (the "NO" branch of decision tree 58), the process includes incrementing i. As illustrated at the block 510, a next untested set is chosen as a new $set_i$. Choosing can be performed using an embodiment previously described with respect to choosing a particular set of memory cells in block 44 of FIG. 4. After incrementing i, the method of erasing the sector proceeds as previously described, with inhibiting erasing of all memory cells within the sector except for the new $set_i$ being performed as previously described for block 52. Eventually, all the memory cells are determined to be erased, (the "YES" branch of decision tree 58), and the process of erasing the sector ends.

For example, referring to FIG. 3, after erasing the set 1211 while inhibiting erasing of the set 1212, each memory cell of the set 1211 is verified as having completed erasing. In one embodiment, the set 1212 has not yet been verified as erased and is selected as the next set to be erased. Erasing is performed on the set 1212 while inhibiting erasing of the set 1211. In another embodiment, erasing and verifying erasing has been completed on all memory cells of sector 1210 other than the set 1211 prior to erasing the set 1211 as described above. After erasing the set 1211, and verifying the erasing of each memory cell of the set 1211, the process of erasing the sector 2110 ends.

A programming table, TABLE 1 (below), is included to aid in understanding the embodiments described above with respect to the FIGS. 4 and 5. TABLE 1 includes an example of voltages that can be used to program, read and erase the nonvolatile memory array 10 according to a particular embodiment. Because the source bit lines 118 are oriented orthogonally to and can be controlled independently from the control gate lines 114, four conditions can exist within the memory matrix 12 during erasing as are outlined below in more detail.

TABLE 1

|  | Source Bit Line | Control Gate Line | Select Gate Line | Drain Bit Line | Substrate |
|---|---|---|---|---|---|
| Program | 4 to 6 V | 6 to 9 V | 1 to 2 V | 0 V | 0 V |
| Read | 0 V | 1 to 2 V | 1 to 2 V | 0 to 2 V | 0 V |
| Erase | 0 V | $\geq$12 V | 0 V | 0 to 2 V | −2 to 0 V |
| Inhibit Erase | 4 to 6 V | $\geq$12 V | 0 V | 0 to 2 V | −2 to 0 V |
| Unselected Erase | 0 V | 1 to 2 V | 0 V | 0 to 2 V | −2 to 0 V |
| Unselected Inhibit | 4 to 6 V | 1 to 2 V | 0 V | 0 to 2 V | −2 to 0 V |

Referring to FIG. 3, in one embodiment, the sector 1210 is selected to be erased, and the sector 1220 is an unselected sector. During the erasing cycle, memory cell 311 is erased while memory cell 312 is inhibited from erasing. In one embodiment, the control gate line 371 of the sector 1210 is placed at greater than approximately 12 V, while the select gate line 391 of the sector 1210 is placed at approximately 0 V. The drain bit line 331 and the drain bit line 332 are placed at approximately 1.2 V. The source bit line 351 is placed at approximately 0 V and the source bit line 352 is placed at approximately 5 V. A potential difference of greater than approximately 12 V is formed between the control gate and source memory cell 311, while a potential difference of less than approximately 12 V is formed between the control gate and source of memory cell 312. Thus, erasing occurs in memory cell 311 while, at substantially the same point in time, erasing is inhibited in memory cell 312.

The source bit line 351 and the source bit line 352 are electrically coupled to the sector 1220, such that during erasing the sector 1210, the sources of the memory cells 321 and 322 of the sector 1220 are placed at a potentials of the source bit lines 351 and 352, respectively. For example, when memory cell 311 is erasing and memory cell 312 is inhibited from erasing, the source bit line 351 is at a lower potential than the source bit line 352. In one embodiment, the potential of control gate line 372 of the sector 1220 is placed between the voltage of the source line 351 and the voltage of a source line 352. In a particular embodiment, illustrated in FIG. 3, the source line 351 is placed at approximately 0 V, while the source bit line 352 is placed at the erase inhibit voltage.

In the illustrated embodiment, the control gate line 372 of the sector 1220 is placed at approximately 1.5 V, and the select gate line 392 of the sector 1220 is placed at approximately 0 V. The drain bit line 331, the drain bit line 332, the source bit line 351, and the source bit line 352 are placed at potentials as previously described with respect to memory cell 311 and memory cell 312.

An electronic device including an NVM array with a sector including a plurality of source bit lines, each source bit line corresponding to a particular data I/O, is described. By forming such a device, source regions of different sets of memory cells of a sector can be placed at different potentials during erasing the sector. By placing the source at a voltage, a voltage difference between the source and control gate electrodes can be controlled for each data I/O. Therefore, the flow of charges through the tunnel oxide of a particular set of memory cell during an erase cycle can be inhibited while other memory cells of the sector are erased.

By inhibiting erasing of one set of memory cells of a sector while erasing another set of memory cells of the same sector, fewer charges tunnel through the tunnel oxide of the one set of memory cells during the erase of the sector. Since charge trapping increases as a function of total charge passed through a tunnel oxide, passing fewer charges through the tunnel oxide during a process of erasing can increase the life of the electronic device. Also, by inhibiting erasing of a set of memory cell after they have been verified as erased, a range of a final distribution of $V_{th}$ for the memory cells of the sector can be decreased.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a method of using an electronic device including a nonvolatile memory array can include erasing a first memory cell within a first sector of the nonvolatile memory array, and inhibiting erasing a second memory cell within the first sector while erasing the first memory cell.

In one embodiment of the first aspect, inhibiting erasing the second memory cell can include placing a source of the second memory cell at a higher potential than a drain of the second memory cell. In a particular embodiment, inhibiting erasing the second memory cell can include placing a source bit line at a potential. The source bit line can be electrically coupled to sources of a group of memory cells, wherein the group of memory cells includes the second memory cell within the first sector, and a third memory cell within a second sector. In a more particular embodiment, erasing the first memory cell includes forming a first potential difference between a control gate of the first memory cell and the source of the first memory cell. Inhibiting erasing the second memory cell can include forming a second potential difference between a control gate of the second memory cell and the source of the second memory cell, and forming a third potential difference between a control gate of the third memory cell and a source of the third memory cell. The first potential difference can be greater than the second potential difference, and the second potential difference can be greater than the third potential difference.

In another embodiment of the first aspect, erasing the first memory cell includes erasing all memory cells within the first sector prior to inhibiting erasing the second memory cell within the first sector. In still another embodiment, inhibiting erasing the second memory cell includes inhibiting erasing of all memory cells within the first sector except for a set of memory cells that includes the first memory cell. A group of memory cells corresponds to a data I/O and includes the set of memory cells.

In another particular embodiment of the first aspect, the method can further include verifying erasing the first memory cell after erasing the first memory cell. In a more particular embodiment, verifying erasing the first memory cell includes using a same data I/O as would be used when the first memory cell is read.

In a second aspect, a method of using an electronic device including a nonvolatile memory array can include providing a nonvolatile memory array, wherein the nonvolatile memory array includes a first sector including a first memory cell, wherein the first memory cell includes a first source. The nonvolatile memory array can also include a second sector including a second memory cell, wherein the second memory cell includes a second source. The method can also include verifying an erase of the first memory cell, and inhibiting a further erase of the first memory cell. Inhibiting the further erase of the first memory cell can include placing the first source at a first potential, and placing the second source at a second potential substantially the same as the first potential.

In a particular embodiment of the second aspect, the method can further include erasing a third memory cell within the first sector. Erasing the third memory cell can be performed at substantially a same point in time as inhibiting the further erase of the first memory cell. In a more embodiment, the method can further include erasing all memory cells within the first sector prior to inhibiting the further erase of the first memory cell. In a still more particular embodiment, the method can further include selecting the first memory cell for erase verification prior to verifying the erase of the first memory cell.

In another more particular embodiment of the second aspect, the method can further include inhibiting the further erase of the first memory cell after verifying the erase of the first memory cell. In another particular embodiment, inhibiting the further erase of the first memory cell can include placing the first source to a higher potential than a first drain of the first memory cell. In still another particular embodiment, inhibiting the further erase of the first memory cell can include inhibiting the erase of all memory cells within the first sector except for a set of memory cells including the third memory cell.

In another particular embodiment of the second aspect, inhibiting the further erase of the first memory cell can include forming a first potential difference between a control gate of the first memory cell and the source of the first memory cell, and forming a second potential difference between a control gate of the second memory cell and a source of the second memory cell. Erasing the third memory cell can include forming a third potential difference between a control gate of the third memory cell and a source of the third memory cell. The first potential difference can be greater than the second potential difference, and the first potential difference can be less than the third potential difference. In another embodiment, verifying the erase of the first memory cell can include using a same data I/O as would be used when the first memory cell is read.

In a third aspect, an electronic device can include a first memory cell within a first sector of a nonvolatile memory array. The first memory cell can include a first source electrically coupled to a first data I/O. The electronic device can also include a second memory cell within the first sector. The second memory cell can include a second source electrically coupled to a second data I/O. The first source can be electrically insulated from the second source, and the first data I/O can be different from the second data I/O.

In one embodiment of the third aspect, the electronic device can further include a third memory cell within a second sector of the nonvolatile memory array. The third memory cell includes a third source electrically coupled to the first source of the first memory cell. The electronic device can also include a fourth memory cell within the second sector of the nonvolatile memory array. The fourth memory cell includes a fourth source electrically coupled to the second source of the second memory cell. In a more particular embodiment, the first memory cell can further include a first drain, a first select gate electrically coupled to a first select gate line, and a first control gate electrically coupled to a first control gate line. The second memory cell can further include a second drain, a second select gate electrically coupled to the first select gate line, and a second control gate electrically coupled to the first control gate line. The third memory cell further includes a third drain electrically coupled to the first drain, a third select gate electrically coupled to a second select gate line different from the first select gate line, and a third control gate electrically coupled to a second control gate line different from the first control gate line.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of using an electronic device including a nonvolatile memory array comprising:
   erasing a first plurality of memory cells simultaneously during a first erase pulse, wherein the first plurality of memory cells include a first memory cell and a second memory cell:
   further erasing the first memory cell during a second erase pulse after the first erase pulse; and
   inhibiting erasing the second memory cell while further erasing the first memory cell during the second erase pulse.

2. The method of claim 1, wherein inhibiting erasing the second memory cell comprises placing a source of the second memory cell at a higher potential than a drain of the second memory cell.

3. The method of claim 2, wherein inhibiting erasing the second memory cell comprises placing a source bit line at a potential, wherein the source bit line is electrically coupled to sources of a group of memory cells, wherein the group of memory cells includes:
   the second memory cell within a first sector; and
   a third memory cell within a second sector.

4. The method of claim 3, wherein:
further erasing the first memory cell includes forming a first potential difference between a control gate of the first memory cell and the source of the first memory cell;
inhibiting erasing the second memory cell includes:
   forming a second potential difference between a control gate of the second memory cell and the source of the second memory cell; and
   forming a third potential difference between a control gate of the third memory cell and a source of the third memory cell;
the first potential difference is greater than the second potential difference; and
the second potential difference is greater than the third potential difference.

5. The method of claim 1, wherein:
the first and second memory cells are within a first sector; and
erasing the first memory cell during the first erase pulse comprises erasing all memory cells within the first sector prior to inhibiting erasing the second memory cell within the first sector.

6. The method of claim 1, wherein:
the first and second memory cells are within a first sector; and
inhibiting erasing the second memory cell comprises inhibiting erasing of all memory cells within the first sector except for a set of memory cells that includes the first memory cell, wherein a group of memory cells corresponds to a data I/O and includes the set of memory cells.

7. The method of claim 1, further comprising verifying erasing the first memory cell after further erasing the first memory cell.

8. The method of claim 7, wherein verifying erasing the first memory cell comprises using a same data I/O as would be used when the first memory cell is read.

9. The method of claim 1 wherein:
the first memory cell includes a first source electrically coupled to a first data I/O; and
the second memory cell includes a second source electrically coupled to a second data I/O, wherein:
   the first source is electrically insulated from the second source; and
   the first data I/O is different from the second data I/O.

10. The method of claim 9, wherein the nonvolatile memory array further comprises:
a third memory cell within a second sector of the nonvolatile memory array, wherein the third memory cell includes a third source electrically coupled to the first source of the first memory cell; and
a fourth memory cell within the second sector of the nonvolatile memory array, wherein the fourth memory cell includes a fourth source electrically coupled to the second source of the second memory cell.

11. The method of claim 10, wherein:
the first memory cell further includes:
   a first drain;
   a first select gate electrically coupled to a first select gate line; and
   a first control gate electrically coupled to a first control gate line;
the second memory cell further includes:
   a second drain;
   a second select gate electrically coupled to the first select gate line; and
   a second control gate electrically coupled to the first control gate line; and
the third memory cell further includes:
   a third drain electrically coupled to the first drain;
   a third select gate electrically coupled to a second select gate line different from the first select gate line; and
   a third control gate electrically coupled to a second control gate line different from the first control gate line.

12. A method of using an electronic device including a nonvolatile memory array comprising:
providing a nonvolatile memory array, wherein the nonvolatile memory array includes:
   a first sector including a first memory cell and a second memory cell, wherein the first memory cell includes a first source, and the second memory cell includes a second source; and
   a second sector including a third memory cell, wherein the third memory cell includes a third source;
erasing all memory cells within the first sector, including the first memory cell and the second memory cell during a first erase pulse;
verifying an erase of the first and second memory cells;
further erasing the first memory cell during a second erase pulse after the first erase pulse; and
inhibiting a further erase of the second and third memory cell, wherein inhibiting the further erase of the second and third memory cells is performed during the second erase pulse.

13. The method of claim 12, wherein the first and third memory cells are coupled to different data I/Os within the first sector.

14. The method of claim 13, wherein the first and second memory cells are coupled to the same data I/O.

15. The method of claim 12, further comprising selecting the first and second memory cells for erase verification prior to verifying the erase of the first and second memory cells.

16. The method of claim 12, wherein inhibiting the further erase of the second and third memory cells is performed after verifying the erase of the first and second memory cells.

17. The method of claim 12, wherein inhibiting the further erase of the second and third memory cells comprises placing a source of a second memory cell to a higher potential than a drain of the second memory cell.

18. The method of claim 12, wherein:
the nonvolatile memory array further comprises a fourth memory cell within the first Sector, wherein the fourth memory cell is coupled to the same data I/O as the first memory cell; and
further erasing the first memory during a second erase pulse comprises further erasing the fourth memory cell during the second erase pulse.

19. The method of claim 12, wherein:
inhibiting the further erase of the second and third memory cells includes:
   forming a first potential difference between a control gate of the second memory cell and the source of the second memory cell; and
   forming a second potential difference between a control gate of the third memory cell and a source of the third memory cell; and
the first potential difference is less than the second potential difference.

20. The method of claim 12, wherein verifying the erase of the first and second memory cells comprises, for the first memory cell using a same data I/O as would be used when the first memory cell is read.

* * * * *